US010403573B2

(12) United States Patent
Chang

(10) Patent No.: US 10,403,573 B2
(45) Date of Patent: Sep. 3, 2019

(54) FABRICATION METHOD OF SEMICONDUCTOR SUBSTRATE

(71) Applicant: Siliconware Precision Industries Co., Ltd., Taichung (TW)

(72) Inventor: Wei-Che Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/867,199

(22) Filed: Jan. 10, 2018

(65) Prior Publication Data

US 2018/0158774 A1 Jun. 7, 2018

Related U.S. Application Data

(62) Division of application No. 14/477,131, filed on Sep. 4, 2014, now Pat. No. 9,899,314.

(30) Foreign Application Priority Data

Dec. 24, 2013 (TW) ............................ 102147923 A

(51) Int. Cl.
*H01L 23/522* (2006.01)
*H01L 21/768* (2006.01)
*H01L 23/532* (2006.01)

(52) U.S. Cl.
CPC ...... *H01L 23/5226* (2013.01); *H01L 21/7681* (2013.01); *H01L 21/76802* (2013.01); *H01L 21/76807* (2013.01); *H01L 21/76831* (2013.01); *H01L 23/53295* (2013.01); *H01L 2221/1031* (2013.01); *H01L 2224/16225* (2013.01); *H01L 2224/32225* (2013.01); *H01L 2224/73204* (2013.01); *H01L 2924/0002* (2013.01); *H01L 2924/15311* (2013.01)

(58) Field of Classification Search
CPC ........... H01L 23/5226; H01L 23/53295; H01L 21/76831; H01L 21/76802
See application file for complete search history.

(56) References Cited

U.S. PATENT DOCUMENTS

2012/0074520 A1 3/2012 Yang et al.
2013/0130498 A1* 5/2013 Feustel ............ H01L 21/76807 438/675
2013/0270703 A1 10/2013 Zierath et al.

* cited by examiner

*Primary Examiner* — Jamie C Niesz

(74) *Attorney, Agent, or Firm* — Mintz Levin Cohn Ferris Glovsky and Popeo, P.C.; Peter F. Corless; Steven M. Jensen

(57) ABSTRACT

A method for fabricating a semiconductor substrate is disclosed, which includes: forming a first dielectric layer on a substrate body; foil ling a plurality of first vias penetrating the first dielectric layer to expose portions of the substrate body; forming a second dielectric layer on the first dielectric layer and the exposed portions of the substrate body, wherein the second dielectric layer extends on walls of the first vias; etching the second dielectric layer to form a plurality of openings communicating with the first vias and form a plurality of second vias penetrating the second dielectric layer in the first vias so as to expose portions of the substrate body, leaving the second dielectric layer on the walls of the first vias; and forming a circuit layer in the openings, and forming a plurality of conductive vias in the second vias for electrically connecting the circuit layer and the substrate body.

6 Claims, 7 Drawing Sheets

FABRICATION METHOD OF SEMICONDUCTOR SUBSTRATE

CROSS-REFERENCE TO RELATED APPLICATION(S)

This application is a divisional of application U.S. Ser. No. 14/477,131, filed on Sep. 4, 2014, which claims under 35 U.S.C. § 119(a) the benefit of Taiwanese Application No. 102147923, filed Feb. 24, 2013, the entire contents of which are incorporated herein by reference.

BACKGROUND OF THE INVENTION

1. Field of the Invention

The present invention relates to substrates and fabrication methods thereof, and more particularly, to a semiconductor substrate and a fabrication method thereof.

2. Description of Related Art

Flip-chip technologies facilitate to reduce chip packaging sizes and shorten signal transmission paths and therefore have been widely used for chip packaging. Various types of packages such as chip scale packages (CSPs), direct chip attached (DCA) packages and multi-chip module (MCM) packages can be achieved through flip-chip technologies.

In a flip-chip packaging process, a big CTE (Coefficient of Thermal Expansion) mismatch between a chip and a packaging substrate adversely affects the formation of joints between conductive bumps of the chip and contacts of the packaging substrate, thus easily resulting in delamination of the conductive bumps from the packaging substrate. On the other hand, along with increased integration of integrated circuits, a CTE mismatch between a chip and a packaging substrate induces more thermal stresses and leads to more serious warpage, thereby reducing the product reliability and resulting in failure of a reliability test.

Accordingly, an interposer made of a semiconductor material close to a semiconductor chip has been developed to overcome the above-described drawbacks caused by a CTE mismatch.

FIG. 1 is a schematic cross-sectional view showing a conventional package structure having a silicon interposer. Such a package structure not only overcomes the above-described drawbacks, but also has a reduced layout area.

For example, a packaging substrate generally has a minimum line width/pitch of 12/12 um. When the I/O count of a semiconductor chip increases, since the line width/pitch of the packaging substrate cannot be reduced, the area of the packaging substrate must be increased such that more circuits can be formed on the packaging substrate and electrically connected to the semiconductor chip having high I/O count. On the other hand, referring to FIG. 1, a plurality of semiconductor chips 11 are disposed on a silicon interposer 12 having through silicon vias (TSVs) and the silicon interposer 12 is further disposed on a packaging substrate 13. As such, the semiconductor chips 11 are electrically connected to the packaging substrate 13 through the silicon interposer 12. Through a semiconductor process, the silicon interposer 12 can have a line width/pitch of 3/3 um or less. Therefore, the semiconductor chips 11 having high I/O counts can be disposed on the through silicon interposer 2 without the need to increase the area of the packaging substrate 13. Further, the fine line width/pitch of the through silicon interposer 12 facilitates to shorten the electrical transmission path. Therefore, compared with semiconductor chips directly disposed on a packaging substrate, the semiconductor chips 11 disposed on the silicon interposer 12 can achieve a higher electrical transmission speed (efficiency).

However, when fine circuits are formed on either the side of the silicon interposer facing the semiconductor chip or the other side of the silicon interposer facing the packaging substrate through a semiconductor process, the fine circuits easily delaminate from a dielectric layer, thereby reducing the reliability of the silicon interposer.

Accordingly, a self-aligned dual damascene process is developed, which is shown in FIGS. 2A to 2I.

Referring to FIG. 2A, a first dielectric layer 21 is formed on a substrate body 20 and an etch stop layer 22 is formed on the first dielectric layer 21.

Referring to FIG. 2B, a first resist layer 23 is formed on the etch stop layer 22 and patterned to expose portions of the etch stop layer 22.

Referring to FIG. 2C, the exposed portions of the etch stop layer 22 and the first dielectric layer 21 under the exposed portions of the etch stop layer 22 are removed to form a plurality of first openings 24. Then, the first resist layer 23 is removed.

Referring to FIG. 2D, a second dielectric layer 25 is formed on the etch stop layer 22 and filled in the first openings 24.

Referring to FIG. 2E, a second resist layer 26 is formed on the second dielectric layer 25 and patterned to expose portions of the second dielectric layer 25.

Referring to FIG. 2F, the exposed portions of the second dielectric layer 25 and the etch stop layer 22 under the exposed portions of the second dielectric layer 25 are removed by etching to form second openings 27. The first openings 24 are further etched to form vias 210 that expose portions of the substrate body 20 and communicate with the second openings 27.

Referring to FIG. 2G, the second resist layer 26 is removed.

Referring to FIG. 2H, a metal layer 28 is formed in the vias 210 and the second openings 27 and on a top surface of the second dielectric layer 25 by electroplating.

Referring to FIG. 2I, the metal layer 28 on the top surface of the second dielectric layer 25 is removed by grinding. As such, the metal layer 28 in the second openings 27 constitutes a circuit layer 282 and the metal layer 28 in the vias 210 constitutes conductive vias 281 for electrically connecting the circuit layer 282 and the substrate body 20.

Therefore, by embedding the circuit layer in the dielectric layer, the self-aligned dual damascene process can prevent circuit delamination and fabricate ultra-fine circuits. However, the process needs to deposit an etch stop layer between the first dielectric layer and the second dielectric layer so as to achieve self-aligned etching through a high etch rate difference between the etch stop layer and the first or second dielectric layer. The etch stop layer made of such as silicon nitride generally has a high dielectric constant, which induces a large capacitance effect, such as an RC delay. The thicker the etch stop layer, the larger the capacitance effect and the lower the electrical signal transmission speed.

Therefore, how to overcome the above-described drawbacks has become critical.

SUMMARY OF THE INVENTION

In view of the above-described drawbacks, the present invention provides a method for fabricating a semiconductor substrate, which comprises the steps of: forming a first dielectric layer on a substrate body; forming a plurality of first vias penetrating the first dielectric layer to expose portions of the substrate body; forming a second dielectric layer on the first dielectric layer and the exposed portions of the substrate body, wherein the second dielectric layer extends on walls of the first vias; etching the second dielectric layer to form a plurality of openings communicating with the first vias and form a plurality of second vias penetrating the second dielectric layer in the first vias so as to expose portions of the substrate body, leaving the second dielectric layer on the walls of the first vias; and forming a circuit layer in the openings, and forming a plurality of conductive vias in the second vias for electrically connecting the circuit layer and the substrate body.

In an embodiment, when the second dielectric layer is formed, the second dielectric layer does not completely fill the first vias.

In an embodiment, the etching step further comprises etching portions of the first dielectric layer so as for the openings to extend into the first dielectric layer.

In an embodiment, forming the circuit layer and the conductive vias comprises: forming a metal layer in the first vias and the openings and on a top surface of the second dielectric layer by electroplating; and removing the metal layer on the top surface of the second dielectric layer such that the metal layer in the openings constitutes the circuit layer and the metal layer in the second vias constitutes the conductive vias.

In an embodiment, the metal layer on the top surface of the second dielectric layer is removed by chemical mechanical polishing (CMP).

In the above-described method, the first dielectric layer and the second dielectric layer can be made of silicon oxide, and the circuit layer and the conductive vias can be made of copper.

The present invention further provides a semiconductor substrate, which comprises: a substrate body; a first dielectric layer formed on the substrate body and having a plurality of first vias exposing portions of the substrate body; a second dielectric layer formed on the first dielectric layer and in the first vias, wherein a plurality of openings are formed in the second dielectric layer and communicating with the first vias, and a plurality of second vias are formed to penetrate the second dielectric layer in the first vias so as to expose portions of the substrate body, leaving the second dielectric layer on walls of the first vias; a circuit layer formed in the openings; and a plurality of conductive vias formed in the second vias for electrically connecting the circuit layer and the substrate body.

In an embodiment, the openings extend into the first dielectric layer.

In the above-described semiconductor substrate, the first dielectric layer and the second dielectric layer can be made of silicon oxide, and the circuit layer and the conductive vias can be made of copper.

Therefore, the present invention dispenses with the etch stop layer so as to reduce the fabrication cost, prevent the capacitance effect and simplify the fabrication process. Further, the present invention can reduce the critical diameters of the second vias and the conductive vias.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "a" etc. are merely for illustrative purposes and should not be construed to limit the scope of the present invention.

FIGS. 3A to 3I are schematic cross-sectional views showing a semiconductor substrate and a fabrication method thereof according to the present invention.

Figure 1:
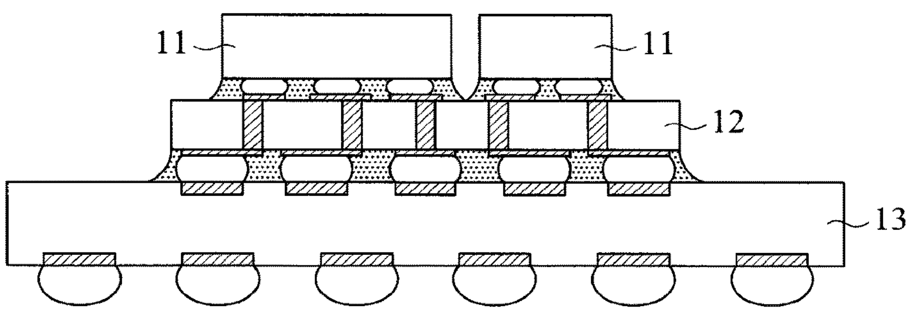
FIG. 1 is a schematic cross-sectional view of a conventional package structure having a silicon interposer.
Figure 2A:
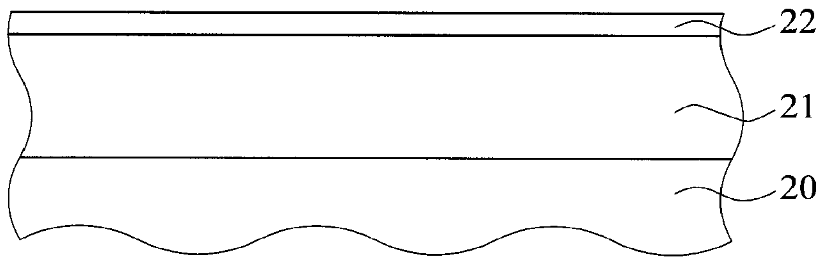
FIGS. 2A to 2I are schematic cross-sectional view showing a conventional self-aligned dual damascene process.
Figure 2B:
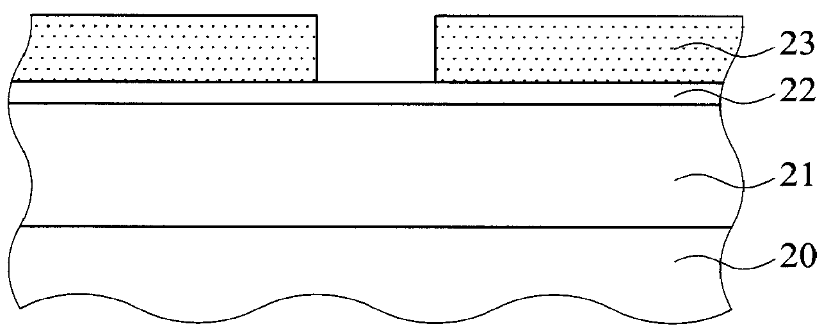
Figure 2C:
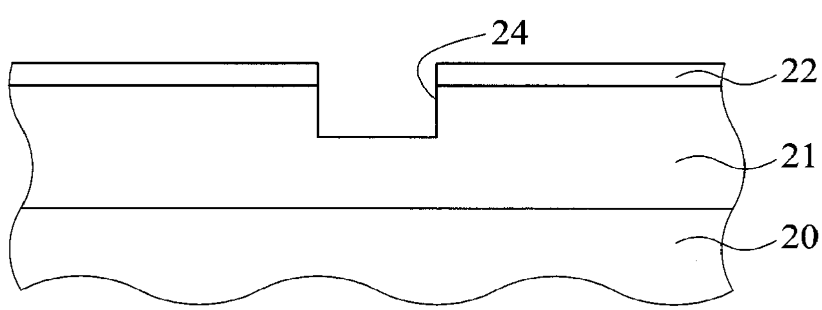
Figure 2D:
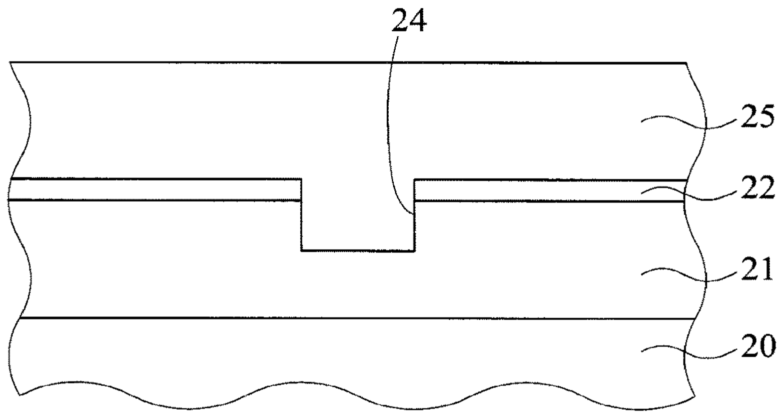
Figure 2E:
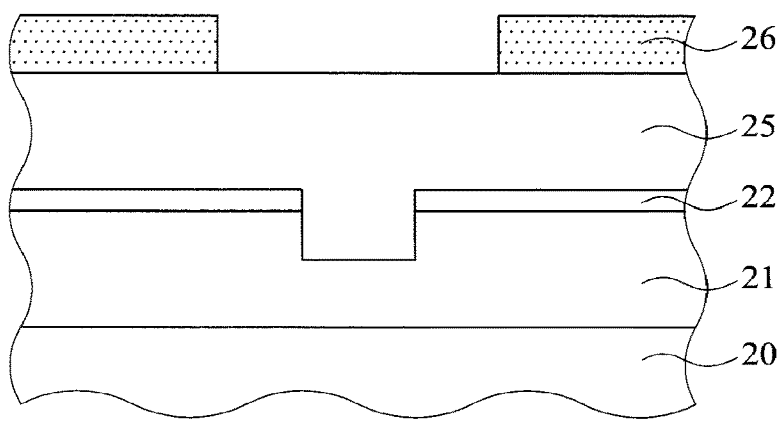
Figure 2F:
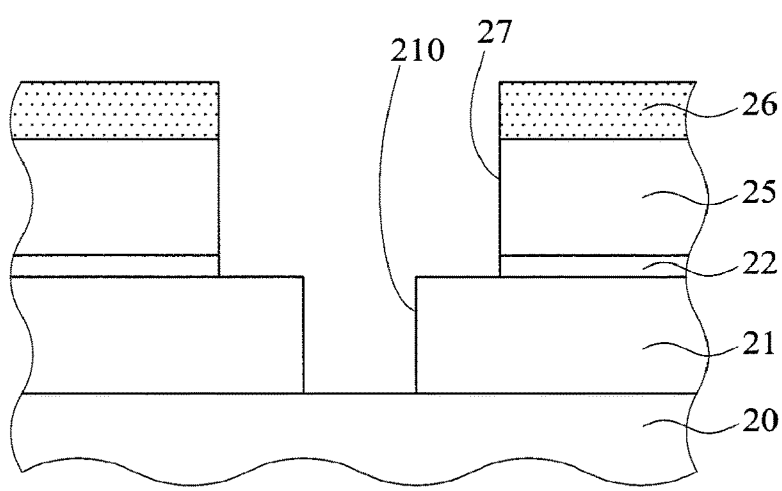
Figure 2G:
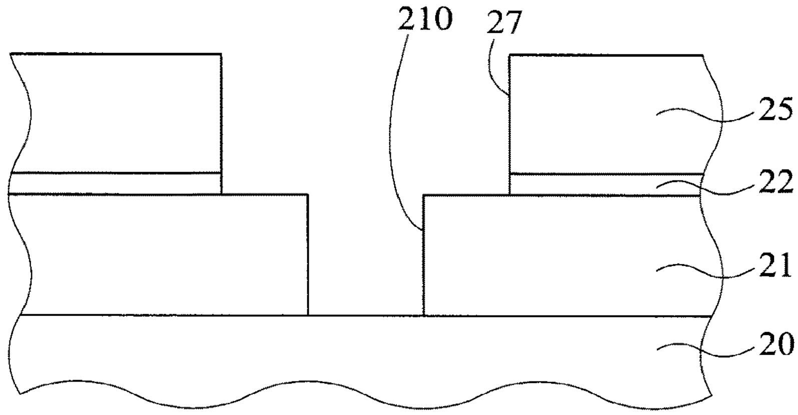
Figure 2H:
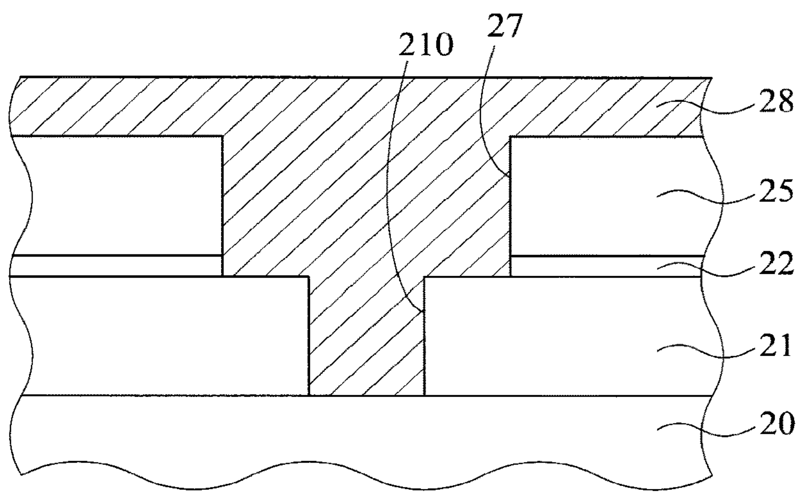
Figure 2I:
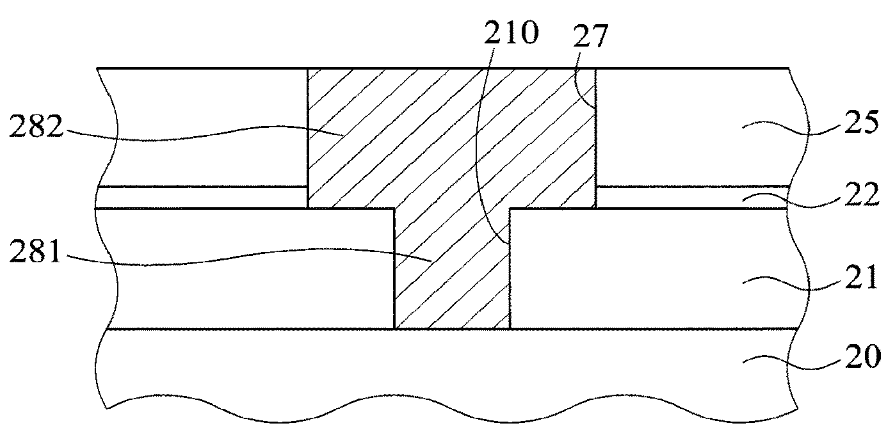
Figure 3A:
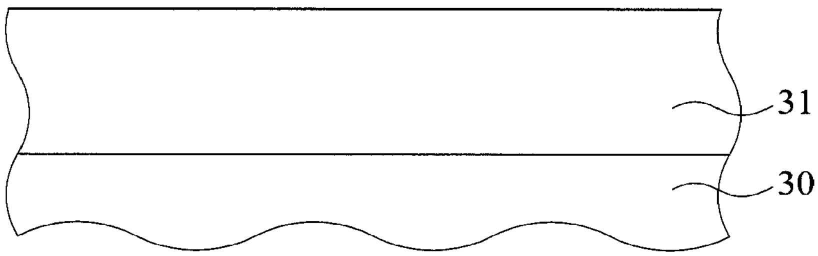
FIGS. 3A to 3I are schematic cross-sectional views showing a semiconductor substrate and a fabrication method thereof according to the present invention.

Referring to FIG. 3A, a first dielectric layer 31 is formed on a substrate body 30. The first dielectric layer 31 can be made of silicon oxide. The substrate body 30 can have circuits (not shown) formed thereon.

Figure 3B:
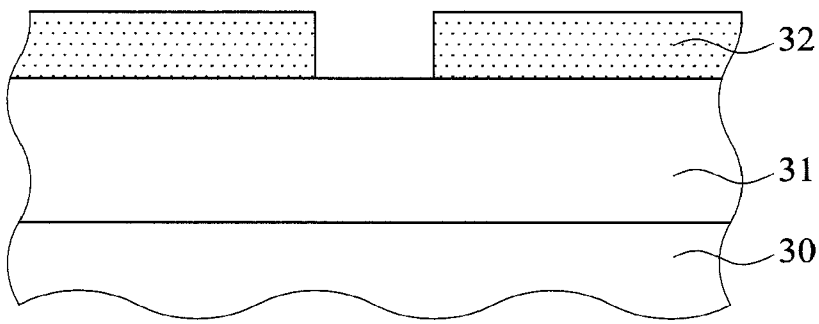

Referring to FIG. 3B, a first resist layer 32 is formed on the first dielectric layer 31 and patterned to expose portions of the first dielectric layer 31.

Figure 3C:
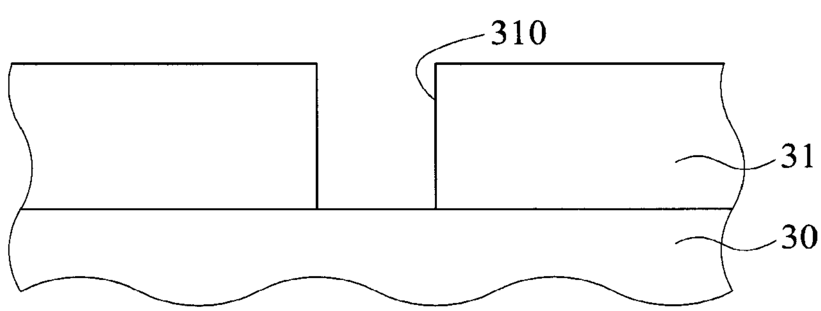

Referring to FIG. 3C, the exposed portions of the first dielectric layer 31 are removed by etching to form a plurality of first vias 310 penetrating the first dielectric layer 31 and exposing portions of the substrate body 30. Then, the first resist layer 32 is removed.

Figure 3D:
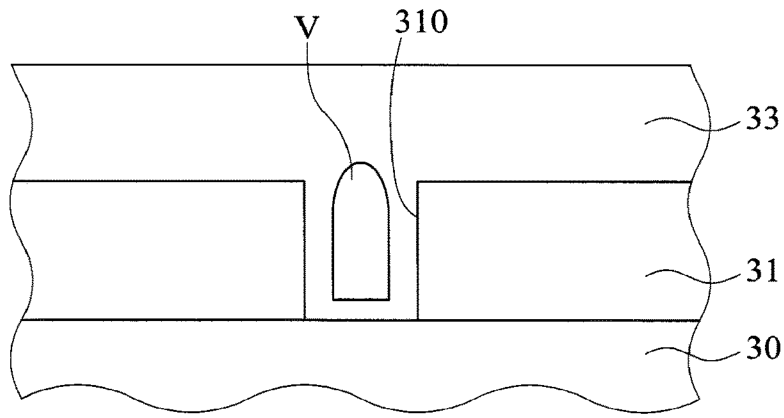

Referring to FIG. 3D, a second dielectric layer 33 is formed on the first dielectric layer 31 and the exposed portions of the substrate body 30. The second dielectric layer 33 can be made of silicon oxide. The second dielectric layer 33 further extends on walls of the first vias 310. Preferably, the second dielectric layer 33 has a poor gap filling capability such that the second dielectric layer 33 does not completely fill the first vias 310 and spaces V are formed in the first vias 310.

Figure 3E:
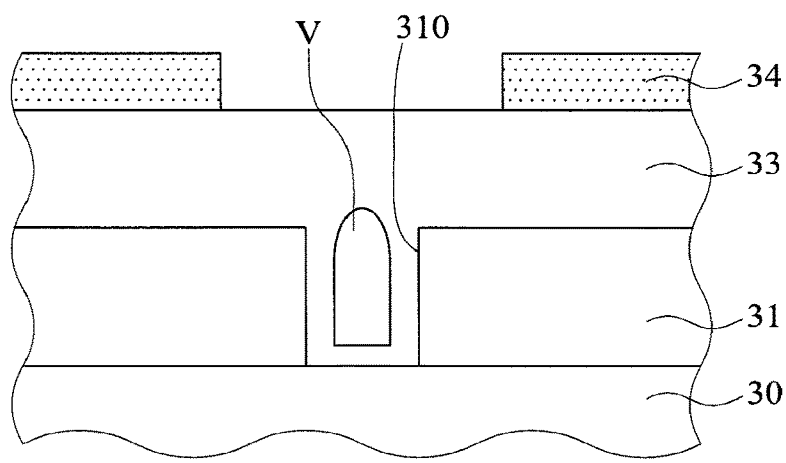

Referring to FIG. 3E, a second resist layer 34 is formed on the second dielectric layer 33 and patterned to expose portions of the second dielectric layer 33.

Figure 3F:
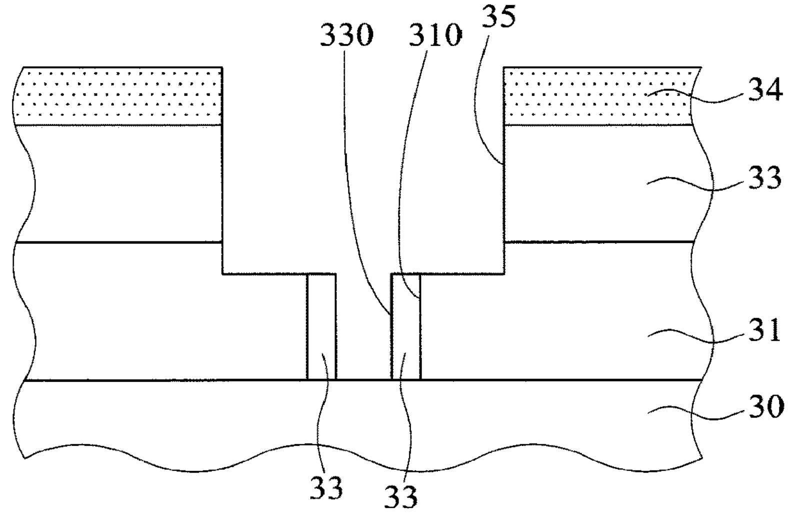

Referring to FIG. 3F, the exposed portions of the second dielectric layer 33 and portions of the first dielectric layer 31 under the second dielectric layer 33 are removed by etching so as to form a plurality of openings 35 communicating with the first vias 310 and a plurality of second vias 330 penetrating the second dielectric layer 33 in the first vias 310 for exposing portions of the substrate body 30, and the second dielectric layer 33 on the walls of the first vias 310 is retained. Although the openings 35 extend into the first dielectric layer 31 in the present embodiment, the invention is not limited thereto.

Figure 3G:
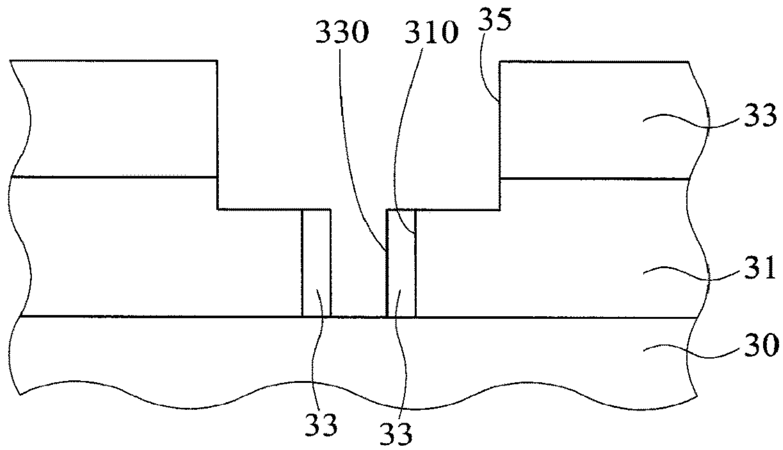

Referring to FIG. 3G the second resist layer 34 is removed.

Figure 3H:
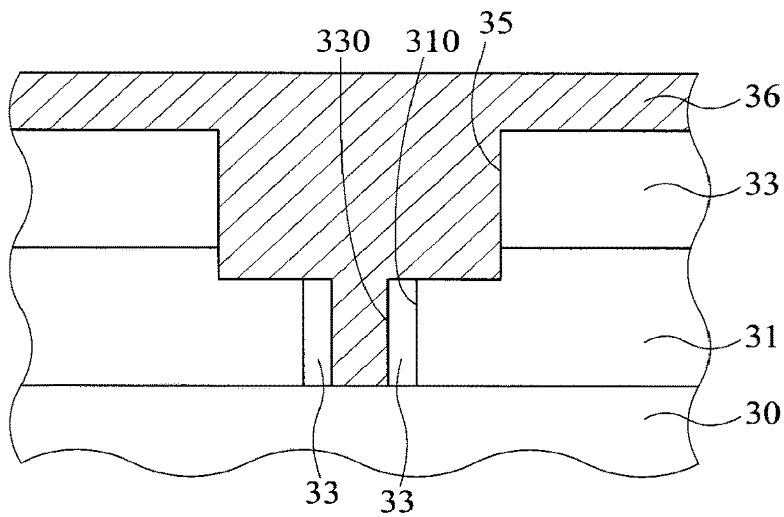

Referring to FIG. 3H, a metal layer 36 is formed in the first vias 310, the openings 35 and a top surface of the second dielectric layer 33. The metal layer 36 can be made of copper.

Figure 3I:
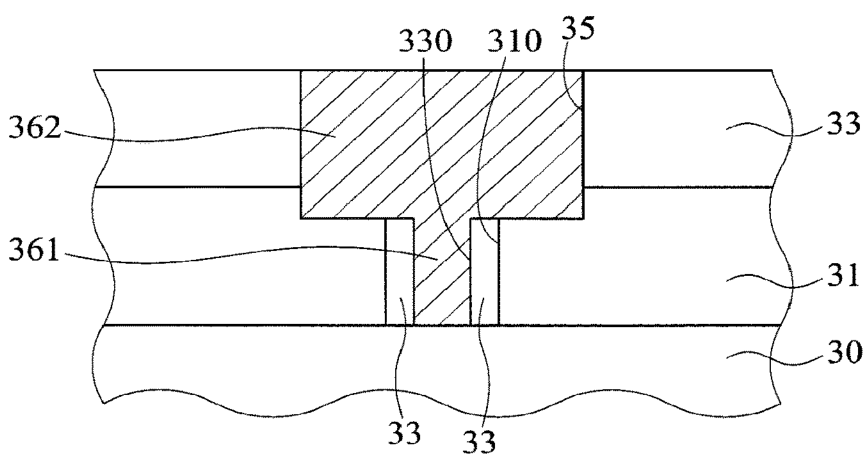

Referring to FIG. 3I, the metal layer 36 on the top surface of the second dielectric layer 33 is removed by a chemical mechanical polishing (CMP) process. As such, the metal layer 36 in the openings 35 constitutes a circuit layer 362 and the metal layer 36 in the second vias 330 constitutes a plurality of conductive vias 361 for electrically connecting the circuit layer 362 and the substrate body 30.

The present invention further provides a semiconductor substrate, which has: a substrate body 30; a first dielectric layer 31 formed on the substrate body 30 and having a plurality of first vias 310 exposing portions of the substrate body 30; a second dielectric layer 33 formed on the first dielectric layer 31 and in the first vias 310, wherein a plurality of openings 35 are formed in the second dielectric layer 33 and communicating with the first vias 310, and a plurality of second vias 330 are formed to penetrate the second dielectric layer 33 in the first vias 310 so as to expose portions of the substrate body 30, leaving the second dielectric layer 33 on walls of the first vias 310; a circuit layer 362 formed in the openings 35; and a plurality of conductive vias 361 formed in the second vias 330 for electrically connecting the circuit layer 362 and the substrate body 30.

In the above-described semiconductor substrate, the openings 35 further extend into the first dielectric layer 31.

In the above-described semiconductor substrate, the first dielectric layer 31 and the second dielectric layer 33 can be made of silicon oxide, and the circuit layer 362 and the conductive vias 361 can be made of copper.

Therefore, the present invention dispenses with the etch stop layer so as to reduce the fabrication cost and prevent the capacitance effect induced by the etch stop layer and simplify the fabrication process. Further, since the second dielectric layer does not completely fill the first vias, the present invention can shorten the time to form the second vias via etching and reduce the critical diameters of the second vias and the conductive vias.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a semiconductor substrate, comprising the steps of:

forming a first dielectric layer on a substrate body;

forming a plurality of first vias penetrating the first dielectric layer to expose portions of the substrate body;

forming a second dielectric layer on the first dielectric layer and the exposed portions of the substrate body, wherein the second dielectric layer extends on walls of the first vias, wherein when the second dielectric layer is formed, the second dielectric layer does not completely fill the first vias and at least one closed space is formed in the first vias;

etching the second dielectric layer to form a plurality of openings communicating with the first vias and form a plurality of second vias penetrating the second dielectric layer in the first vias so as to expose portions of the substrate body, leaving the second dielectric layer on the walls of the first vias; and forming a circuit layer in the openings, and forming a plurality of conductive vias in the second vias for electrically connecting the circuit layer and the substrate body.

2. The method of claim 1, wherein the etching step further comprises etching portions of the first dielectric layer so as for the openings to extend into the first dielectric layer.

3. The method of claim 1, wherein forming the circuit layer and the conductive vias comprises:

forming a metal layer in the first vias and the openings and on a top surface of the second dielectric layer by electroplating; and removing the metal layer on the top surface of the second dielectric layer such that the metal layer in the openings constitutes the circuit layer and the metal layer in the second vias constitutes the conductive vias.

4. The method of claim 3, wherein the metal layer on the top surface of the second dielectric layer is removed by chemical mechanical polishing (CMP).

5. The method of claim 1, wherein the first dielectric layer and the second dielectric layer are made of silicon oxide.

6. The method of claim 1, wherein the circuit layer and the conductive vias are made of copper.

* * * * *